United States Patent [19]

Alcorn et al.

[11] 3,986,912

[45] Oct. 19, 1976

[54] PROCESS FOR CONTROLLING THE WALL INCLINATION OF A PLASMA ETCHED VIA HOLE

[75] Inventors: George Edward Alcorn, Silver Spring, Md.; James Downer Feeley, Marshall, Va.

[73] Assignee: International Business Machines Corporation, Armonk, N.Y.

[22] Filed: Sept. 4, 1975

[21] Appl. No.: 610,216

[52] U.S. Cl. ................................ 156/11; 156/13; 156/17; 204/192
[51] Int. Cl.² ...................................... H01L 21/312
[58] Field of Search ............... 156/11, 13, 17, 2; 204/192 E, 192 EC; 29/578, 580

[56] References Cited
UNITED STATES PATENTS

| | | | |
|---|---|---|---|
| 3,519,506 | 7/1970 | Topas | 156/17 |
| 3,591,465 | 7/1971 | McKeluey | 156/13 |
| 3,664,942 | 5/1972 | Hauas et al. | 204/192 E |
| 3,847,690 | 11/1974 | Campbell et al. | 156/13 |
| 3,867,216 | 2/1975 | Jacob | 156/17 |
| 3,880,684 | 4/1975 | Abe | 156/17 |

*Primary Examiner*—Douglas J. Drummond
*Assistant Examiner*—Jerome W. Massie
*Attorney, Agent, or Firm*—John E. Hoel

[57] ABSTRACT

A process is disclosed for controlling the inclination of the side wall of a layer of sputtered quartz etched by a reactive plasma etching technique. The process consists of coating a selected fractional area of the backside of a silicon wafer to be etched, with a material resistant to plasma etching. Then coating the front side of the wafer bearing a layer of sputtered quartz, with a coating of organic material having a temperature dependent plasma etching rate, so as to delineate locations in the sputtered quartz layer for the formation of via holes. Next, exposing the wafer in a reactive plasma etching chamber. The inclination of the side wall of the via hole etched in the sputtered quartz layer by the reactive plasma etching step, may be controlled through the correlation of the selected area of exposure of the backside of the wafer, to the operating temperature under which the etching process proceeds which, in turn, governs the rate at which the organic layer is etched around the periphery of the via hole.

10 Claims, 16 Drawing Figures

PROCESS FOR CONTROLLING THE WALL INCLINATION OF A PLASMA ETCHED VIA HOLE

FIELD OF THE INVENTION

The invention disclosed relates to a process for etching semiconductor device structures and particularly relates to a process for reactive plasma etching of sputtered quartz in a semiconductor device.

BACKGROUND OF THE INVENTION

Via holes formed by conventional etching techniques in silicon dioxide and sputtered quartz layers of semiconductor structures, have a cross-sectional configuration with sharp edge contours. The via hole in the layer of sputtered quartz will normally have a relatively sharp upper edge where the side walls meet the top surface of the layer. These sharp edges, particularly when combined with steep side wall surfaces, can lead to reduced thicknesses in metallized via pads and interconnection metallurgy stripes in a conductor stepdown, leading to conductor cracking, reducing the reliability of the semiconductor device.

The prior art has approached this problem by depositing the sputtered quartz layer to be etched, so as to have a varying etchable nature which changes in the thickness direction. The major portion of the layer, for example the bottom portion, is produced by conventional sputtering.

The top portion of the layer is deposited so that it will have a faster etch rate. This is accomplished by reducing the sputtering rate by varying the conditions within the sputtering apparatus. It has been found, however that the control of the variability of the etch rate of the sputtered quartz with thickness, cannot be uniformally maintained. Thus the inclination of the via hole wall produced by this prior art process, cannot be reliably made uniform from wafer to wafer or from batch to batch.

OBJECTS OF THE INVENTION

It is therefore the object of the invention to produce an inclined via hole wall in an improved manner.

It is another object of the invention to provide an inclined via hole wall, in a reproducible manner.

It is still a further object of the invention to accurately control the inclination of a via hole wall so as to attain a pre-selected angle.

SUMMARY OF THE INVENTION

These and other objects, features and advantages of the invention are accomplished by the method for controlling the inclination of the side wall of a layer of silicon dioxide etched by a reactive plasma etching technique, disclosed herein. This consists of coating a selected fractional area of the backside of the wafer to be etched, with a material resistant to plasma etching. Then coating the front side of the wafer bearing a layer of silicon dioxide or sputtered quartz, with a coating of organic material having a temperature dependent plasma etching rate, so as to delineate locations in the silicon dioxide layer for the formation of via holes. The process further comprises exposing the wafer in a reactive plasma etching chamber. The resultant side wall of the via hole etched in the reactive plasma etching step, has a pre-selected inclination which is controlled through the correlation of the selected area of exposure of the backside of the wafer to the operating temperature under which the etching process proceeds which, in turn, governs the rate at which the organic layer is etched around the periphery of the via hole.

DESCRIPTION OF THE FIGURES

These and other objects, features, and advantages of the invention will be more particularly described with reference to the accompanying figures.

DISCUSSION OF THE PREFERRED EMBODIMENT

A technique for controlling the inclination of the sidewall of a reactive plasma etched via hole, is disclosed. An example of an apparatus for performing a reactive plasma etching technique is disclosed in U.S. Pat. No. 3,806,365. A reactive chamber is connected to a source of an organo-halide gas, such as carbon tetrafluoride and a supply of oxygen. The reactive chamber is surrounded by a radio frequency exitation coil connected to a radio frequency generator. The pressure of the gases within the reactive chamber is controlled by a vacuum pump. When the radio frequency generator drives the exitation coil surrounding the reactive chamber, the organo-halide molecules and oxygen molecules contained therein, are converted to a plasma state. Materials exposed to the plasma thus obtained in the reactive chamber, undergo a chemical etching at a rate characteristic of the material to be etched.

Organic materials have an etch rate in a reactive plasma, which is in proportion to the temperature at which the operation is carried out. In conventional reactive plasma etching processes for semiconductor wafers, an organic photoresist material is coated on the front or circuit side of the wafer so as to delineate those regions on the wafer which are to be etched. In conventional reactive plasma etching of semiconductor wafers, the backside of the semiconductor wafer remains uncoated and exposed to the plasma ambient. The backside of a silicon wafer, for example, thus exposed is correspondingly etched and this operation causes the temperature of the wafer to rise. The corresponding increase in the temperature of the photoresist layer on the front side of the wafer, causes it to be more subject to the etching action of the reactive plasma than would otherwise be the case at a lower temperature. At the higher operating temperature, the photoresist will etch completely through in a penumbral region about an area to be etched during its exposure in the reactive plasma chamber. This premature errosion causes an undesired etching of the semiconductor work piece in the regions surrounding the area where etching is desired. The instant process provides a method for controlling the incline of the silicon-dioxide via hole wall through the agency of controlling the temperature of the silicon wafer by means of covering a selected fraction of the backside surface of the wafer with a layer of material which will protect the silicon from reactive plasma etching. The fraction of the total area of the backside of the wafer covered by the photoresist can be correlated with the resulting slope of the side walls and the etched structures on the front side of the wafer.

Figure 1A:
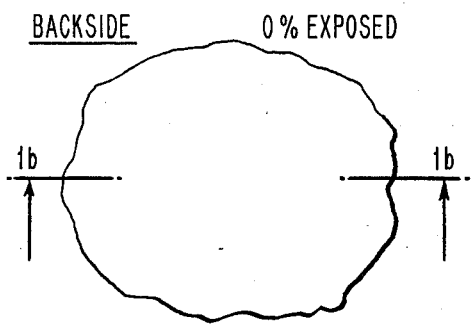
FIG. 1a is a partial view of the backside of a semiconductor wafer fully coated with the thermal masking material 12.

FIG. 1a shows a portion of a backside of a semiconductor wafer 10 coated with a layer 12 of material which will protect the silicon surface from the reactive plasma etching. The material 12 may be, for example, photoresist such as AZ1350J type manufactured by the Azoplate Corporation of Murray Hill, N.J., having a thickness of approximately 30,000A, baked at a temperature of approximately 140° C for approximately 30 minutes. In FIG. 1a, it is seen that none of the backside of the semiconductor wafer 10 is exposed through the layer 12.

Figure 1B:
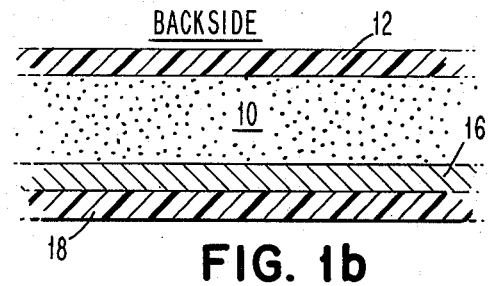
FIG. 1b is a cross-sectional view along section 1—1' of FIG. 1a, showing the backside upward in the figure.

FIG. 1b illustrates a cross-sectional view of the wafer of FIG. 1a showing the layer 16 of sputtered quartz or thermal oxide grown to a thickness of approximately 10,000A. It should be recognized that the layer 16 may alternatively be silicon nitride, silicon, refractory metal, organic passivation material, or any other material susceptible to plasma etching. A layer of organic photoresist 18 is deposited on layer 16, having a thickness of 30,000A, and can be for example AZ1350J manufactured by the Azoplate Corporation of Murray Hill, N.J. The layer 18 is baked at a temperature of approximately 140° C for approximately 30 minutes. The layer 18 need not be limited to this specific material but may instead, be an electron beam exposed resist such as polymethyl methacrylate or any other coating material having the property of a temperature dependent reactive plasma etching rate.

Figure 1C:
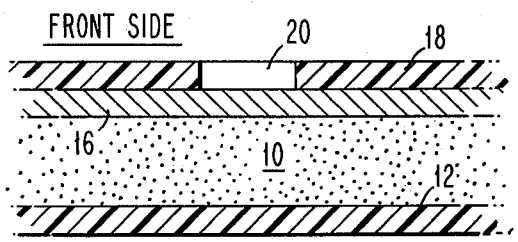
FIG. 1c is a cross-sectional view of the wafer of FIG. 1a after the hole 20 has been made in the organic coating 18, with the figure showing the front side upward.

FIG. 1c shows a cross-sectional view of the wafer of FIG. 1b and 1a. It is desired to form a via hole through the sputtered quartz layer 16. To this end a hole 20 is formed in the photoresist layer 18 having substantially the same dimensions as the desired resultant via hole.

The wafer, whose cross-section is shown in FIG. 1c, is introduced to the reactive plasma etching chamber and exposed to a plasma comprising for example, a composition of carbon tetrafluoride and 8% oxygen at a pressure of approximately 1.1 Torr. The oxygen serves as a catalyst for the plasma reaction. The proportion of oxygen may be varied to adjust the speed of the reaction, and thus the etch rate. The exposure time is for approximately 40 minutes at 300 watts of radio frequency power. The reactive plasma etches all exposed surfaces, the exposed surfaces of layer 18, of the sputtered quartz layer 16, and of the photoresist layer 12. Since none of the backside surface of the wafer 10 is exposed to the ambient reactive plasma, the temperature of the wafer at which the etching process takes place is relatively low. The photoresist layer 18 in the area surrounding the hole 20 etches at a relatively slow rate. Therefore the side walls of the resulting via hole 20 through the sputtered quartz layer 16, are relatively vertical having an inclination angle $\theta'$ of approximately 80°.

Figure 2A:
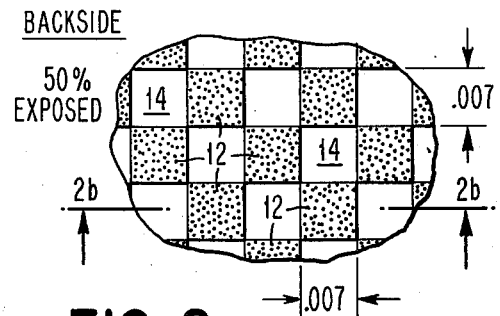
FIG. 2a shows a portion of the backside of a semiconductor wafer having 50% of its surface exposed through the thermal masking layer 12.

A second reactive plasma etching experiment is performed as shown in FIGS. 2a through 2d. The backside of the silicon wafer is coated in a checkerboard fashion as is shown in FIG. 2a. The thickness of the wafer 10 is, for example, 0.015 inches. In order to uniformally distribute the temperature across the front surface of the wafer 10, the periodicity of the checkerboard pattern on the backside of the wafer is 0.007 inches. The squares of thermally protective material 12 are selected to be the same size as the exposed squares of the silicon surface 14. In this way, 50% of the backside of the wafer 10 is exposed to the reactive plasma ambient.

Figure 2B:
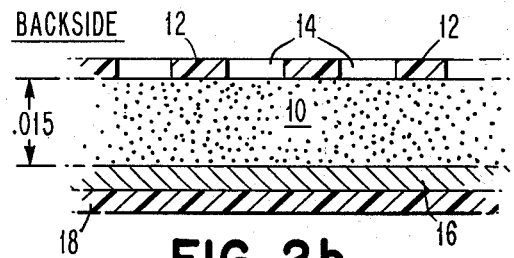
FIG. 2b is a cross-sectional view of the wafer of FIG. 2a taken along the section 2—2', with the backside shown upward.

FIG. 2b is a cross-sectional view along the section 2—2' of the wafer of FIG. 2a. The front side of the wafer 10 has a layer 16 of sputtered quartz or thermally grown oxide having a thickness of approximately 10,000A. On top of layer 16 is a layer of photoresist material 18 having a thickness of 20,000A, similar to that described for FIG. 1b.

Figure 2C:
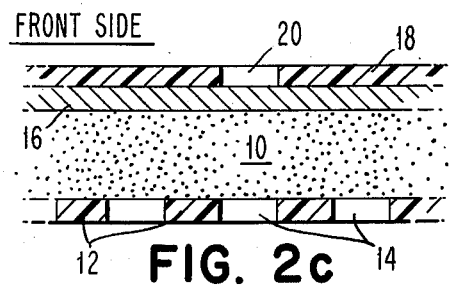
FIG. 2c is a cross-sectional view of the wafer of FIG. 2a after the hole 20 has been made and the organic layer 18, the figure showing the front side upward.

If a via hole is desired to be etched through the sputtered quartz layer 16, the hole 20 is formed in layer 18 having substantially the same dimensions as the desired via hole, as shown in FIG. 2c.

Figure 1D:
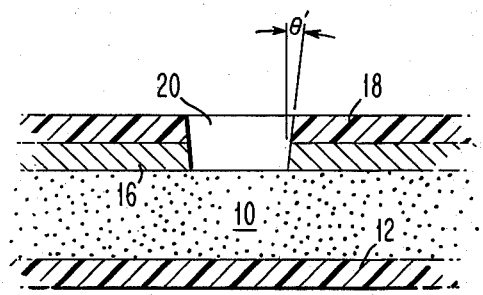
FIG. 1d shows the cross-sectional view of the wafer of FIG. 1c, after having been exposed to a reactive plasma etching process, the figure showing the front side upward.
Figure 2D:
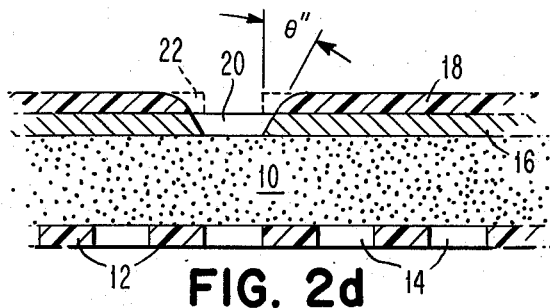
FIG. 2d is the cross-sectional diagram of the wafer of FIG. 2c, after the wafer has been exposed to the reactive plasma etching.

FIG. 2d shows the wafer of FIG. 2c, after it has been exposed to the reactive plasma ambient similar to that described for FIG. 1d. Since 50% of the backside of the wafer 10 is exposed to the reactive plasma ambient, the operating temperature of the wafer at which the front side etching took place, is substantially higher than that of wafer of FIG. 1d. The higher operating temperature for the reactive plasma etching process causes the etch rate for the organic photo resist layer 18 to be higher than it was when the backside of the wafer was fully coated with the protective layer 12 as in FIG. 1d. As the temperature of the wafer rises, primarily due to heat producing silicon plasma reaction on the backside of the wafer in the regions 14, the photoresist layer 18 in the penumbral region 22 begins to more rapidly etch away. There is a horizontal, radial direction to the progression of the etching interface of the penumbral region 22 of the photoresist layer 18, thereby exposing the penumbral region of the sputtered quartz layer 16 for etching by the reactive plasma. This produces a slope to the sputtered quartz layer 16 in the via hole. There results an inclination to the via hole wall in the sputtered quartz layer 16 having an angle $\theta''$ of approximately 60°.

The angle of the inclination $\theta''$ has a one-to-one correspondence with the rate at which the photo resist layer 18 and the penumbral region 22 is removed above the perimeter of the via hole. This may be shown by reference to the next experiment illustrated in the sequence of FIGS 3a through 3d.

Figure 3A:
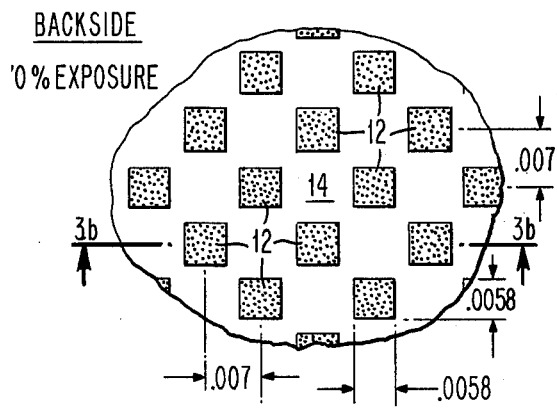
FIG. 3a is a view of a portion of a backside of a semiconductor wafer, 70% of which is exposed by the thermal mask 12.

FIG. 3a shows the backside of a semiconductor wafer 10 being 70% exposed through the spaced array of squares of thermally protective material 12. The thermally protective material 12, may once again be the photoresist material discussed with reference to FIG. 1a.

To accomplish a 70% exposure of the backside of a wafer 10, the squares 12 have a side dimension of 0.0058 inches and a periodicity of 0.007 inches. This periodicity is selected for a wafer thickness of 0.015 inches so as to uniformly distribute the temperature induced by the reactive plasma etching of the backside area 14 of the wafer, across the front side thereof.

Figure 3B:
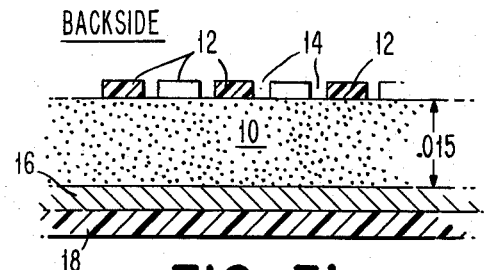
FIG. 3b is a cross-sectional view along the section 3—3' of the wafer shown in FIG. 3a, with the backside upward.

FIG. 3b illustrates the deposition of the sputtered quartz layer 16 and the photoresist layer 18 similar to that discussed FIGS. 1b and 2b.

FIG. 2c illustrates the step of producing a hole 20 in the organic photoresist layer 18 so as to permit the production of a via hole in the layer 16 of sputtered quartz.

Figure 3C:
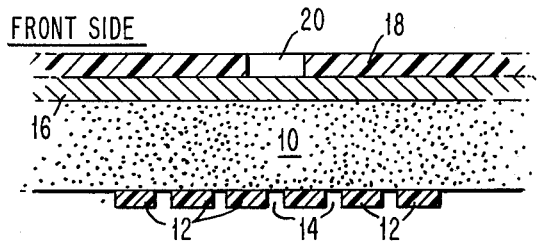
FIG. 3c is a cross-sectional view of the wafer of FIG. 3a after the hole 20 has been made at the organic layer 18, the figure showing the front side upward.
Figure 3D:
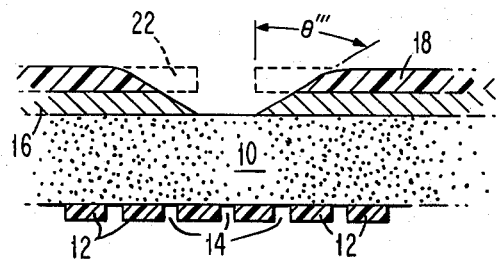
FIG. 3d is a cross-sectional view of the wafer of FIG. 3a, after the wafer has been passed through the reactive plasma etching step, the figure showing the front side upward.

FIG. 3d illustrates the step of placing the wafer shown in FIG. 3c in the reactive plasma etching chamber similar to that described for FIGS. 1d and 2d. In this case, since 70% of the backside of the wafer test exposed to the reactive plasma, the operating temperature at which the etching progresses is still higher than that for the configuration of FIG. 2d or of FIG. 1d. Thus the etching rate of the organic photoresist material 18 is correspondingly higher than was that for layer 18 in FIG. 2d or layer 18 in FIG. 1d. Correspondingly, a greater proportion of the penumbral portion 22 of the organic photoresist layer 18 is removed during the period of exposure of the wafer 10 in the reactive plasma etching chamber. Constantly a greater inclination to the sidewalls of the via hole in the sputtered quartz layer 16, is created resulting in an angle of inclination $\theta''$ of approximately 45°.

Thus it is seen that control of the angle of inclination of the sidewalls of a via hole or other structure etched by the process of reactive plasma etching, can be accomplished by means of masking selected fractions of the backside surface of the semiconductor surface so as to control the operating temperature at which the etching progresses. The temperature dependent property of the organic photoresist which delineates the via hole to be etched, results in the controlled removal of a penumbral portion of that photoresist material thereby exposing progressively more of the upper portion of the structure to be etched, in a controlled manner. Control of the inclination of the sidewalls is thereby obtained.

The selection of the pressure of the reactive plasma of approximately 1.0 Torr is necessary to avoid excessive undercutting which can occur at higher pressures due to the reduced mean free path of the plasma molecules. Useful control of the inclination of the via hole sidewalls can be maintained for reactive plasma operating pressures of from 0.3 Torr to 1.5 Torr. The correlation between via hole wall slope and operating temperature must be emperically determined for each operating pressure.

The etching process proceeds in the sputtered quartz layer in two stages. In the initial stage, the reactive plasma etches the quartz in a substantially vertical direction forming the substantially vertical wall 32 shown in FIGS. 4a and 5a. As the temperature of the wafer rises due principally to the heat producing silicon - plasma reaction on the backside of the wafer, the photoresist layer 18 reaches a critical temperature Tc and begins to etch horizontally in the penumbral region 22 of the via hole. Tc is the critical temperature characteristic of the layer 18 material at which substantial erosion of the material commences due to the reactive plasma. The combined vertical progression of the etching interface in the quartz layer 16 and the horizontal progression of the photoresist etching interface with the consequent horizontal progression of the quartz etching interface, creates a composite etching interface resulting in the sloped via hole wall 34 shown in FIGS. 4a and 5a.

Figure 4A:
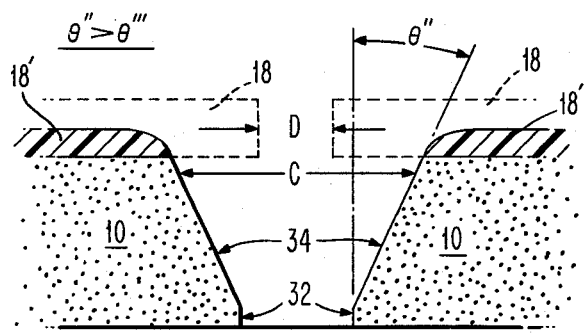
FIG. 4a illustrates in greater detail, the contour of a via hole wall plasma etched, with the wafer backside having a relatively larger fractional exposure.
Figure 4B:
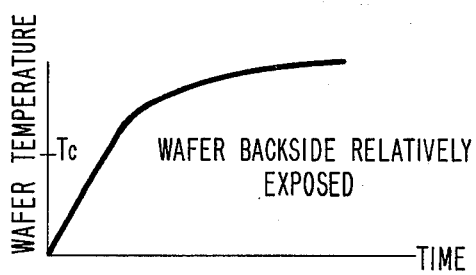
FIG. 4b is a graph of the corresponding wafer temperature with respect to time.

FIG. 4a illustrates in detail, the shape of the via hole side walls when the backside of the wafer has a relatively large fractional exposure as shown in FIG. 3a. The corresponding temperature of the wafer as a function of time is plotted in FIG. 4b. The temperature of the photoresist layer 18 reaches the critical temperature Tc at a relatively early time in the etching period, after which time its etching rate is increased. The resulting via hole wall contour is dominated by the inclined wall 34, there remaining only a small vertical wall component 32. The average angle of inclination $\theta''$ is measured as the angle which the chord line to wall surfaces 32 and 34, makes with respect to the vertical. Etching undercut is defined as the difference between the diameter C at the top of the resultant via hole, and the diameter D of the original hole 20 in the photoresist layer 18. The average angle of inclination and the etching undercut are relatively large, corresponding to the relatively larger fractional exposure of the backside of the wafer.

Figure 5A:
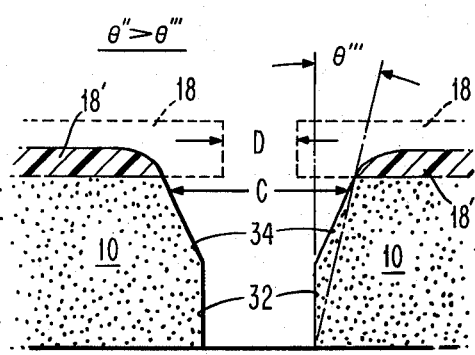
FIG. 5a illustrates in greater detail, the contour of a via hole wall plasma etched, with the wafer backside having a relatively smaller fractional exposure.
Figure 5B:
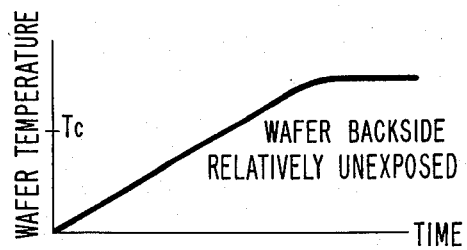
FIG. 5b is a graph of the corresponding wafer temperature with respect to time.

FIG. 5a illustrates in detail, the shape of the via hole side walls when the backside of the wafer has a relatively smaller fractional exposure as shown in FIG. 5b. The temperature of the photoresist layer 18 reaches the critical temperature Tc at a relatively later time in the etching period, after which time its etching rate is increased. The resulting via hole wall contour is comprised of the substantially vertical wall portion 32 and the inclined wall portion 34, shown in FIG. 5a. The average angle of inclination $\theta''$ and the etching undercut C minus D are smaller than those for FIG. 4a, corresponding to the relatively smaller fractional exposure of the backside of the wafer. Via holes with a reduced undercut can be packed more closely on the wafer 10.

The controlled, compound side wall contour for the via hole shown in FIG. 5a will promote the reliability of metal contacts subsequently deposited therein. It is recognized in the prior art that sharply contained via hole edges tend to stress the metal contacts deposited thereon, due to a thinning of the metallic layer where it passes over the sharp edge. The controlled, compound side wall contour for the via hole shown in FIG. 5a, provides more gradual edge contours, promoting increased thickness to the metallic layer where it passes over the edge, thereby enhancing the reliability thereof.

It should be recognized that the rate at which the reactive etching plasma process proceeds is a function of a quantity of material to be etched in the reaction chamber, the pressure at which the operation is carried out, and the rate of flow of the plasma gas, the radio frequency power input, and other process variables. The period of exposure in the reaction chamber can be changed to compensate for changes in these variables. The process disclosed herein should not be limited to sputtered quartz or thermally grown oxide but can be applied to a variety of work piece materials.

While the invention has been particularly shown in described with reference to the preferred embodiment thereof, it will be understood by those skilled in the art that the foregoing and other changes in form and details may be made therein without departing from the spirit and the scope of the invention.

We claim:

1. A method for controlling the inclination of the side wall of a depression in a work piece layer, on a plate-shaped work piece, etched by a reactive plasma etching technique, comprising:

coating a selected fractional area of the backside of the work piece to be etched, with a first material resistant to plasma etching;

coating the front side of said work piece bearing said work piece layer, with a coating of a second material having a temperature dependent reactive plasma etching rate, so as to delineate locations in said work piece layer for the formation of the depression;

exposing said work piece in a reactive plasma etching chamber;

regulating the inclination of the side wall of said depression etched during said reactive plasma etching step by controlling the operating temperature through the correlation of said selected area of exposure of the backside of said work piece to the operating temperature under which the etching process proceeds which, in turn, governs the rate at which said layer of said second material is etched around the periphery of said depression.

2. The process of claim 1 where said work piece is a silicon semiconductor wafer and said work piece layer is sputtered quartz.

3. The process of claim 1 wherein said work piece is a silicon semiconductor wafer and said work piece layer is thermally grown silicon dioxide.

4. The process of claim 1 wherein said work piece is a semiconductor material, said work piece layer is a layer of silicon dioxide, and said depression is a via hole in said silicon dioxide layer.

5. The process of claim 4 wherein said second material is a photoresist.

6. The process of claim 5 wherein said first material is a photoresist.

7. The process of claim 6 wherein the composition of said reactive plasma is carbon tetrafluoride with approximately 8% oxygen.

8. The process of claim 1, wherein said second material is an electron resist.

9. The process of claim 1, wherein said work piece layer is a member of the group consisting of silicon dioxide, quartz, silicon nitride, silicon, refractory metal and organic passivation material.

10. The process of claim 1, wherein said sidewall is comprised of a controlled, compound contour, a lower portion of which is substantially vertical and an upper portion of which is inclined with respect to the vertical, providing a gradual peripheral edge for said depression; whereby a metallized layer deposited over said depression will not be excessively reduced in thickness where passing over said edge.

* * * * *